United States Patent [19]

Betts

[11] 4,128,832
[45] Dec. 5, 1978

[54] COMBINED ENCODER/DECODER

[75] Inventor: William L. Betts, St. Petersburg, Fla.

[73] Assignee: NCR Corporation, Dayton, Ohio

[21] Appl. No.: 647,536

[22] Filed: Jan. 8, 1976

[51] Int. Cl.² .......................................... H03K 13/24
[52] U.S. Cl. .......................................... 340/347 DD
[58] Field of Search .............. 340/347 DD; 325/38 B; 332/11 D

[56] References Cited

U.S. PATENT DOCUMENTS

| | | | |
|---|---|---|---|
| 3,707,680 | 12/1972 | Gabbard | 325/38 B |
| 3,707,712 | 12/1972 | Deschenes | 340/347 DD |
| 3,750,144 | 7/1973 | Bolus | 340/347 DD |
| 3,772,678 | 11/1973 | Deschenes | 340/347 DD |
| 3,793,513 | 2/1974 | Kaneko | 325/38 B |
| 3,937,897 | 2/1976 | Song | 325/38 B |
| 3,949,299 | 4/1976 | Song | 340/347 DD |
| 3,971,891 | 7/1976 | Wolcott | 340/347 DD |

OTHER PUBLICATIONS

Janus, "IBM Technical Disclosure Bulletin," vol. 14, No. 1, Jun. 1971, p. 303.

Primary Examiner—Charles D. Miller
Attorney, Agent, or Firm—J. T. Cavender; Edward Dugas

[57] ABSTRACT

A combined encoder/decoder (transcoder) for multiplexed pulse code modulation/delta modulation conversions utilizes a single set of arithmetic elements to perform both the encoding and decoding functions. An interpolator, a magnitude comparator and an integrator, being the prime arithmetic units, are realigned by switching their serial positions to perform the encoding and decoding functions.

7 Claims, 5 Drawing Figures

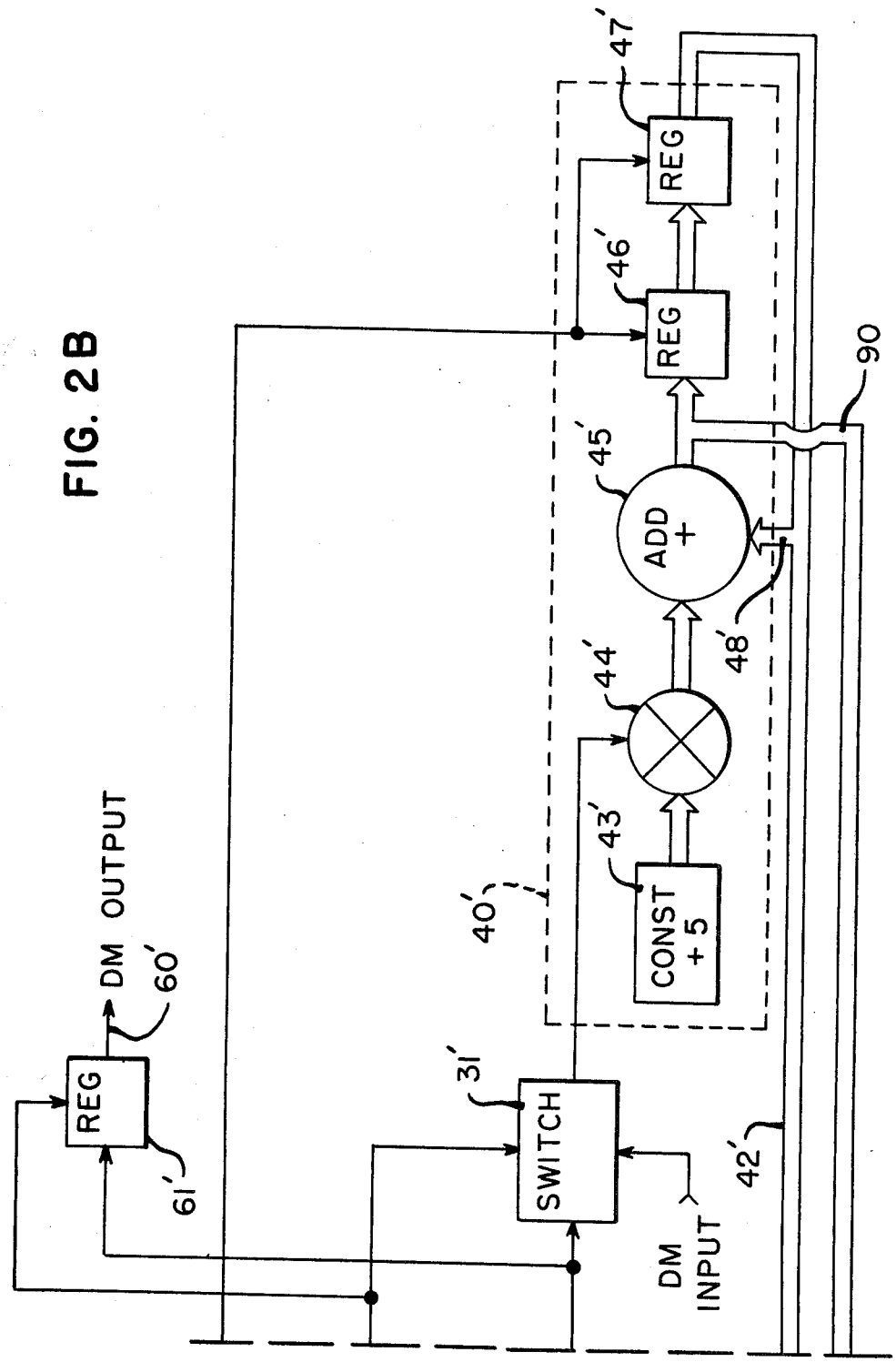

SAMPLE POINTS OF TABLE ONE  FIG. 3
32 KHz CLOCK 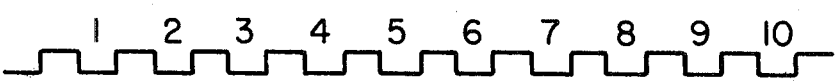
16 KHz CLOCK 
8 KHz CLOCK 
ORIGINAL WAVEFORM (1) OF PCM INPUT
PCM INPUT (1)
DM OUTPUT (6) 
DM INPUT (7) 
DECODED DM (3) 
PCM OUTPUT (4) 
SMOOTH WAVEFORM OF PCM OUTPUT (4) 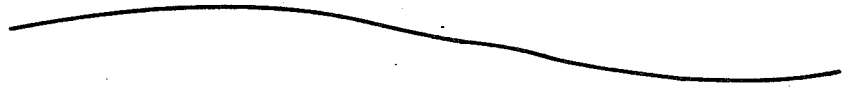

COMBINED ENCODER/DECODER

CROSS-REFERENCE TO RELATED APPLICATIONS

1. U.S. patent application Ser. No. 647,534, entitled "Interpolating Rate Multiplier," by William L. Betts, filed Jan. 8, 1976, now U.S. Pat. No. 4,021,616.

The cross-referenced application is assigned to the NCR Corporation, the assignee of the present application.

BACKGROUND OF THE INVENTION

1. Field of the Invention

The present invention relates to digital data encoders and decoders and more particularly to a combined encoder/decoder (transcoder) for conversions between pulse code modulation and delta modulation.

The time shared digital coder/decoder disclosed herein is used to convert between different sampled data signal formats. Numerous formats are in use today. Those of interest here belong to a family of digital transmission rates of 8000 $n$ b/s wherein $n$ is any integer. These rates apply universally to telecommunications equipment used commerically and in the military in the United States and Europe. The rate family is based on the accepted sampling rate of 8 KHz for 3 KHz bandwidth speech waveforms. The integer $n$ typically indicates the number of bits used to encode the speech samples. For most cases $n = 5, 6, 7$ or 8 bits per channel. We will refer to systems which transmit codewords of $n$ bits per word at 8000 words per second per channel as PCM systems.

2. Description of the Prior Art

Wideband communications links have been established to carry many channels of these digitized signals. Because of the established links, it is anticipated that future systems will use the same 8000 $n$ family of rates. Formats may be expected to change as more efficient encoders/decoders become available.

One new format that is gaining acceptance in the military, and at a slower pace commercially, is delta modulation, including continuously variable slope delta modulation (CVSD). This format provides for rates corresponding to $n = 2, 3,$ or 4 bits per channel.

Delta modulation uses 1 bit codewords transmitted at a higher sampling rate of 16 Kbps to 32 Kbps. It is ideally suited to serial transmission and does not require serial-to-parallel converters and complex synchronizers common to contemporary PCM equipment. (PCM equipment must convert between a serial transmission format and distinct codewords of typically 5, 6, 7 or 8 bits each.)

SUMMARY OF THE INVENTION

The present invention may be used to convert between PCM formats, convert between sampling rates, convert between PCM and delta modulation formats, convert to intermediate formats suitable for conferencing or otherwise processing non-linear formats, or for end user encoding or decoding functions. Its primary advantage is that it may be implemented digitally and the digital components common to encoder and decoder may be efficiently shared to perform both functions.

An object of the invention is to provide a new and improved digital data transcoder.

An additional object is to provide an encoder/decoder having an interpolator, a magnitude comparator and an integrator which are realigned to perform alternatively the encoding and the decoding functions.

An additional object is to provide a combined encoder and decoder for converting pulse code modulation signals to delta modulation signals and delta modulation signals to pulse code modulation signals alternatively.

A further object is to provide a multiplexed combined encoder/decoder for alternatively converting between pulse code modulation signals and delta modulation signals wherein one set of arithmetic elements are alternatively arranged to provide both the encoding and decoding functions.

BRIEF DESCRIPTION OF THE DRAWINGS

These and other objects of the invention will become apparent from the following description taken in connection with the drawings, in which:

FIGS. 2A and 2B constitute FIG. 2 which is a partial schematic drawing of a modification of the invention illustrated in FIG. 1; and FIG. 3 is a set of related waveforms occurring in the embodiments of the invention illustrated in FIGS. 1 and 2.

DESCRIPTION OF THE PREFERRED EMBODIMENT

Figure 1A:
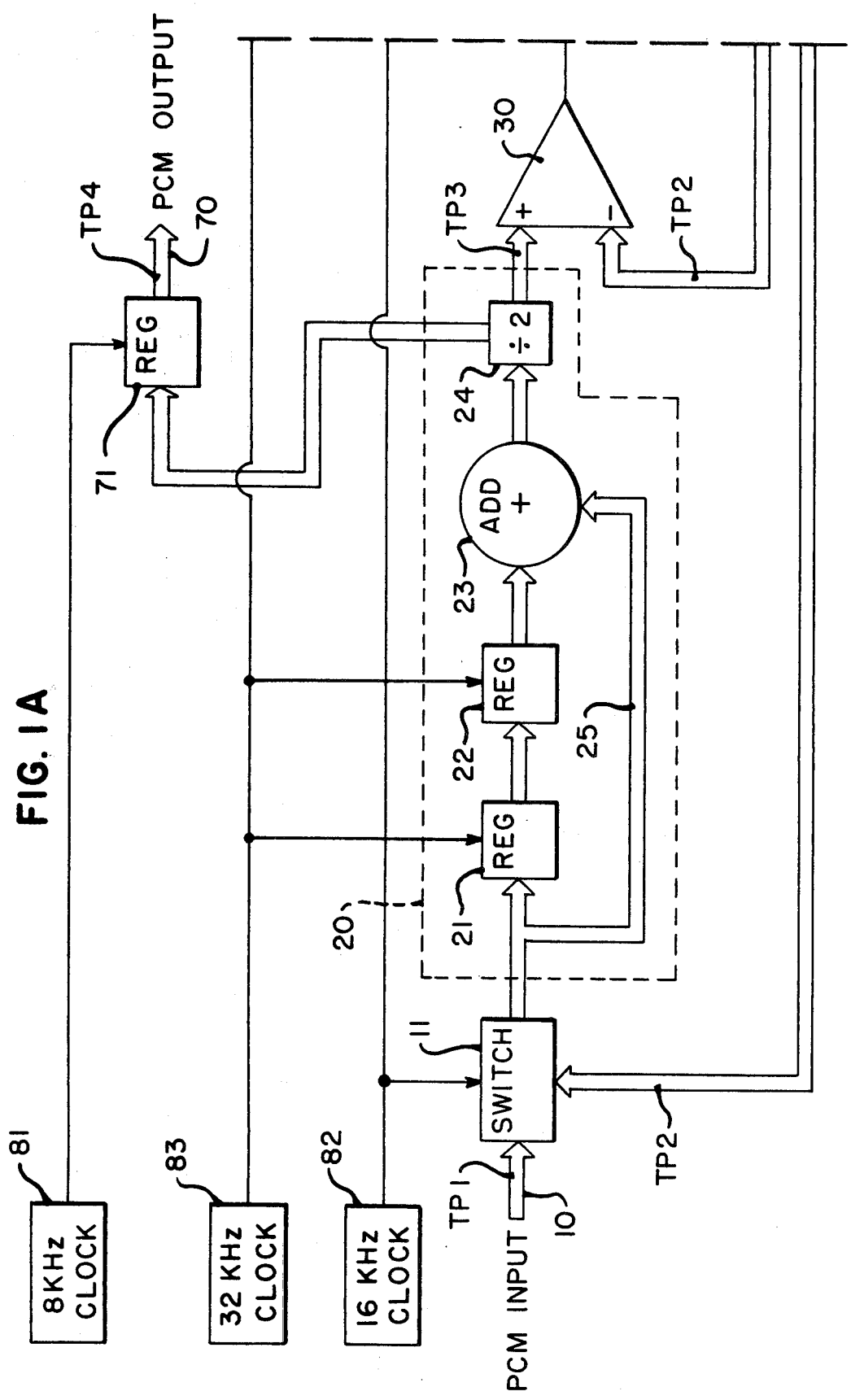
FIGS. 1A and 1B constitute FIG. 1 which is a schematic drawing of a preferred embodiment of the present invention.

While this invention is susceptible of embodiments in many different forms, there is shown in the drawings and will herein be described in detail, embodiments of the invention with the understanding that the present disclosures are to be considered as exemplifications of the principals of the invention and are not intended to limit the invention to the embodiments illustrated. The scope of the invention will be pointed out in the appended claims.

Figure 1B:
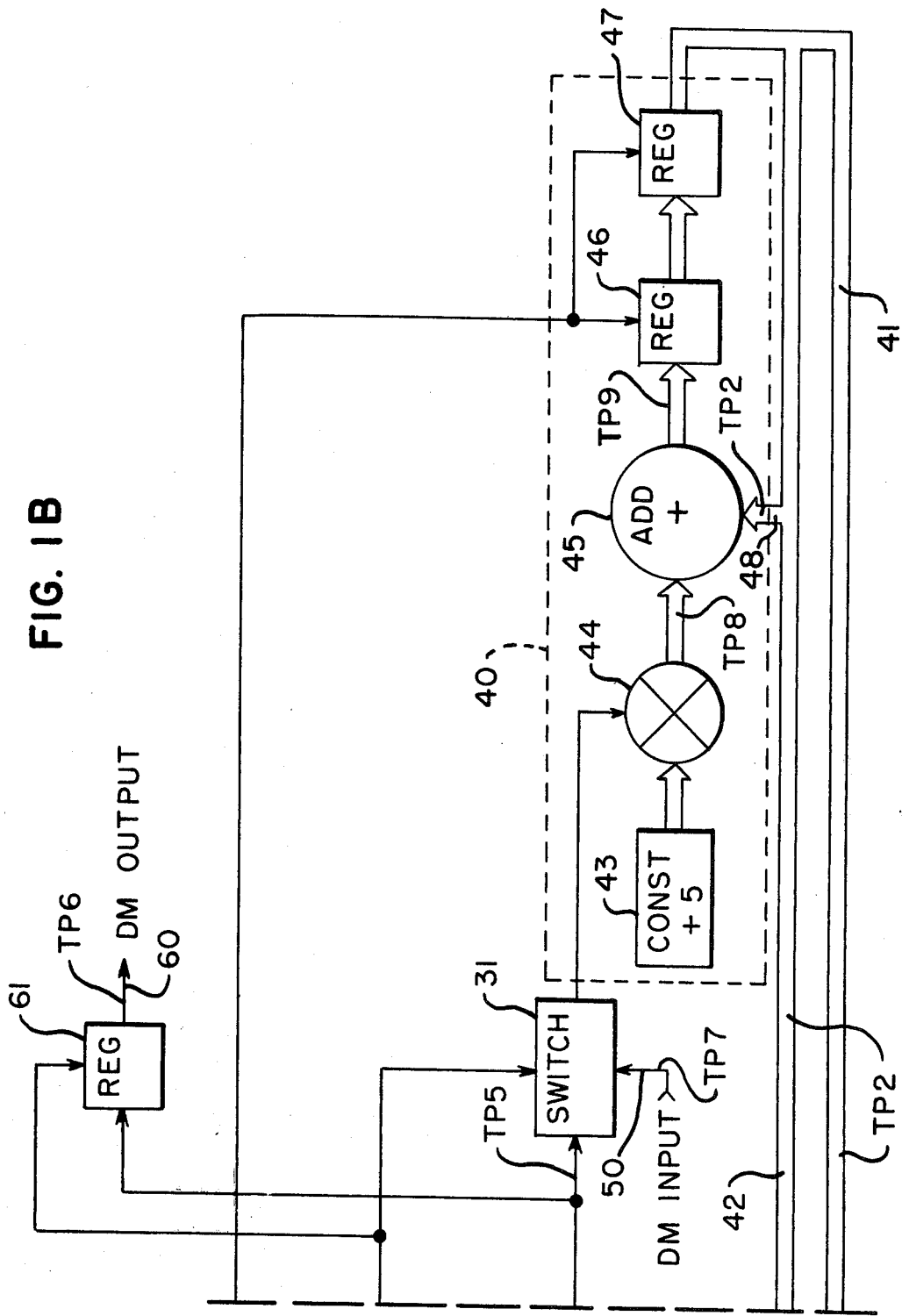

FIG. 1 illustrates a time shared digital coder/decoder (transcoder) which has a pulse code modulation (PCM) input generally indicated at 10, a switch 11, an interpolator indicated by dashed line 20, a comparator 30, a switch 31 and a integrator indicated by dashed line 40 connected in series. Circuit means generally indicated at 41 connect the output of integrator 40 to switch 11. The output of integrator 40 is also connected to an input of the comparator 30 by suitable circuitry generally indicated at 42. A differential modulation (delta modulation-DM) input 50 is connected to the switch 31.

At the instant the circuit is processing a coding of a PCM signal on input 10 to a DM signal at a DM output 60, switch 11 connects the interpolator 20 to input 10 to utilize the interpolator followed by the comparator 30 to perform the encoding and to provide an output of the comparator to the integrator 40. The output of the comparator is connected to the DM output 60 through a shift register 61 and to the integrator 40 input by means of switch 31. Thus, in summary, when PCM is being encoded into DM the PCM input 10, switch 11, interpolator 20, comparator 30, shift register 61 and DM output 60 are connected in series with a feedback loop from the output of the integrator 40 being fed into the comparator 30. The output of the interpolator 20 is connected to a PCM output generally indicated at 70 through a shift register 71. When a delta modulation input signal is to be decoded to a PCM output signal, switch 11 disconnects the PCM input 10 and connects the output of the integrator 40 to the input of interpolator 20. At the same time, switch 31 disconnects the comparator 30 from the input of the integrator 40 and connects the integrator 40 to the DM input 50. Now the switch 31, the integrator 40, the switch 11, the interpolator 20, and the shift register 71 are connected in series to the PCM output 70. Thus, the same interpolator and the same integrator are utilized both for coding and decoding between PCM signals and DM signals, the comparator 30 being utilized only in the encoding of PCM signals to DM signals.

The operation of the circuits will be more easily understood by reference to FIG. 3 and the below table of typical values taken at test points TP1–TP9 shown in FIG. 1. The sample points in the table correspond to the sample points indicated in FIG. 3.

TABLE
SAMPLE VALUES FROM DIGITAL CODER/DECODER

| SAMPLE POINTS | PCM IN (1) | (2) | (3) | PCM OUT (4) | (5) | DM OUT (6) | DM IN (7) | (8) | (9) |
|---|---|---|---|---|---|---|---|---|---|
| 1 | 10 | 0 | 5 | 7.5 | 1 | 1 | — | +5 | 5 |
| 2 | — | 0 | 2.5 | 2.5 | — | 1 | 0 | −5 | −5 |
| 3 | 10 | 5 | 10 | 2.5 | 1 | 1 | — | +5 | 10 |
| 4 | — | −5 | −2.5 | 2.5 | — | 1 | 0 | −5 | −10 |
| 5 | 0 | 10 | 5 | 2.5 | 0 | 0 | — | −5 | 5 |
| 6 | — | −10 | −7.5 | −7.5 | — | 0 | 1 | +5 | −5 |
| 7 | 0 | 5 | 0 | −7.5 | 0 | 0 | — | −5 | 0 |
| 8 | — | −5 | −7.5 | −7.5 | — | 0 | 1 | +5 | 0 |
| 9 | −10 | 0 | −5 | −7.5 | 0 | 0 | — | −5 | −5 |
| 10 | — | 0 | −2.5 | −2.5 | — | 0 | 1 | +5 | 5 |
| 11 | −10 | −5 | −10 | −2.5 | 0 | 0 | — | −5 | −10 |
| 12 | — | 5 | 2.5 | −2.5 | — | 0 | 1 | +5 | 10 |
| 13 | 0 | −10 | −5 | −2.5 | 1 | 1 | — | +5 | −5 |
| 14 | — | 10 | 7.5 | 7.5 | — | 1 | 0 | −5 | 5 |
| 15 | 0 | −5 | 0 | 7.5 | 1 | 1 | — | +5 | 0 |
| 16 | — | 5 | 7.5 | 7.5 | — | 1 | 0 | −5 | 0 |
| 17 | 10 | 0 | 5 | 7.5 | 1 | 1 | — | +5 | 5 |
| 18 | — | 0 | 2.5 | 2.5 | — | 1 | 0 | −5 | −5 |

Referring to FIG. 1, interpolator 20 has a register 21, a shift register 22 and, an adder 23 and a divider 24, connected in series with a direct connection between the input to shift register 21 connected to a second input of adder 23. The integrator 40 has a constant 5 unit PCM word source 43, an inverter 44, an adder 45, a first shift register 46 and a second shift register 47 connected in series. The output of shift register 47 is fed back to the adder 45 by appropriate circuitry generally indicated at 48.

A clock 81 provides 8 KHz pulses to operate shift register 71 at the pulse code modulation rate. Therefore, pulse code modulation output signals are only issued at the 8 KHz rate. A second clock 82 operating at 16 KHz is connected to switches 11 and 31 to switch them between interleaved PCM and DM encoding/decoding. A third clock 83 operating at 32 KHz is connected to the shift registers 21, 22, 46 and 47 to operate them at twice the shifting rate of the switches 11 and 31.

In processing an input PCM signal, the interpolator 20 adds the latest arrived PCM signal to the last incoming PCM signal which has been delayed by passing through registers 21 and 22 and then divides the output in divider 24 by 2 to give an average value of the last two PCM input signals. This is compared to a value which has been arrived at through the delta modulation coding as will be presently described in greater detail.

The integrator 40 receives delta modulation input signals from the input 50 which transforms into a constant +5 or −5 unit steps of PCM coding depending upon the logic "0" or "1" received. These constant 5 unit values are added to the PCM value previously stored in registers 46 and 47, to provide a new PCM value which is then processed through the interpolator 20 before being delivered to register 71 and PCM output 70.

The Table lists numerical values taken at the test points numbered in the block diagram of FIG. 1. FIG. 3 shows waveforms corresponding to selected test points. The top 3 waveforms are clock signals used to sample the registers used in the digital encoder/decoder. All operations are digital and so are best presented in numerical form. However, the data being processed is a digital representation of analog speech waveforms. The waveforms at the bottom of FIG. 3 represent signals that might be observed if a digital-to-analog converter and oscilloscope were connected to the test points.

For illustrative purposes, the waveforms and Table represent the processing of a 2 KHz sine wave. For the 8 KHz PCM format only 4 samples are taken per cycle of the waveform. For the 16 KHz delta modulation (DM) format, 8 samples are taken per cycle of the waveform. To process both encoding and decoding, the time shared digital coder/decoder operates at 32,000 samples per second. 8 samples are taken per cycle of the processed waveform for encoding and decoding.

The Table illustrates the operation of the time shared digital coder/decoder. PCM is converted to DM on the odd sample points (in time). DM is converted to PCM on the even sample points. During sample point 1 a PCM value of 10 is gated to the input of register 21 and adder 23 where it is added to the PCM input value 0 from the last sample stored in register 22. The output sample of TP3 is value 5. This is compared with TP2 which is the last DM estimate (value 0) stored in register 47. The result is a logical 1 which is sampled into DM output register 61 (TP6). The logical output also causes the constant value +5 to be added to the last DM estimate (value 0) stored in register 4. This gives a new DM estimate at TP9 of value 5.

The 32 KHz clock signal then transfers all register input values to the output of each register for use in the next computation. The double register sets 21 and 22 and 46 and 47 provide for intermediate storage of encode and decode values. At this time a DM to PCM cycle begins and switches 11 and 31 are toggled.

The DM input (TP7) is a logical 0 which will cause a value 5 to be subtracted from the last DM estimate (TP2) value 0 to give a new DM estimate (TP9) of −5. Note that this last estimate pertains to samples 2 cycles past. Register 46 holds the PCM to DM sample value computed during sample point 1. This last DM estimate (TP2) from register 47 is gated to register 21 and adder 23 inputs. It is added to register 22 output to yield a new output (TP3) of value 2.5. This value is sampled into the PCM output register 71 (TP4).

The 32 KHz clock 83 then transfers all register inputs to outputs and sample point 3 begins. Note that the old DM estimate at TP2 is value 5 which was computed at TP9 during sample point 1. The value was stored in double register set 46 and 47 to facilitate time shared operation. No switching is required except at the actual circuit inputs (TP1 and TP7). This register concept may be expanded to handle multiple channels as described in my co-pending application Ser. No. 647,534, filed Jan. 8, 1976 for a "Interpolating Rate Multiplier."

The PCM input at TP1 is still value 10 as it was during sample point 1. This is because PCM format calls for an 8 KHz sampling rate. The DM coder, however, must still operate at 16 Kbps to generate new DM estimates and data bit outputs. Value 10 at TP1 is added to the last value 10 stored in register 22 to yield value 10 at TP3. This is greater than the old DM estimate (TP2) value 5. And so a new DM output (TP5 and 6) is generated as a logical 1 and a new DM estimate (TP9) of value 10 is computed.

The time shared encoding and decoding process can be easily followed in the Table. Visual waveforms of FIG. 3 may give insight to this overall process.

Figure 2A:
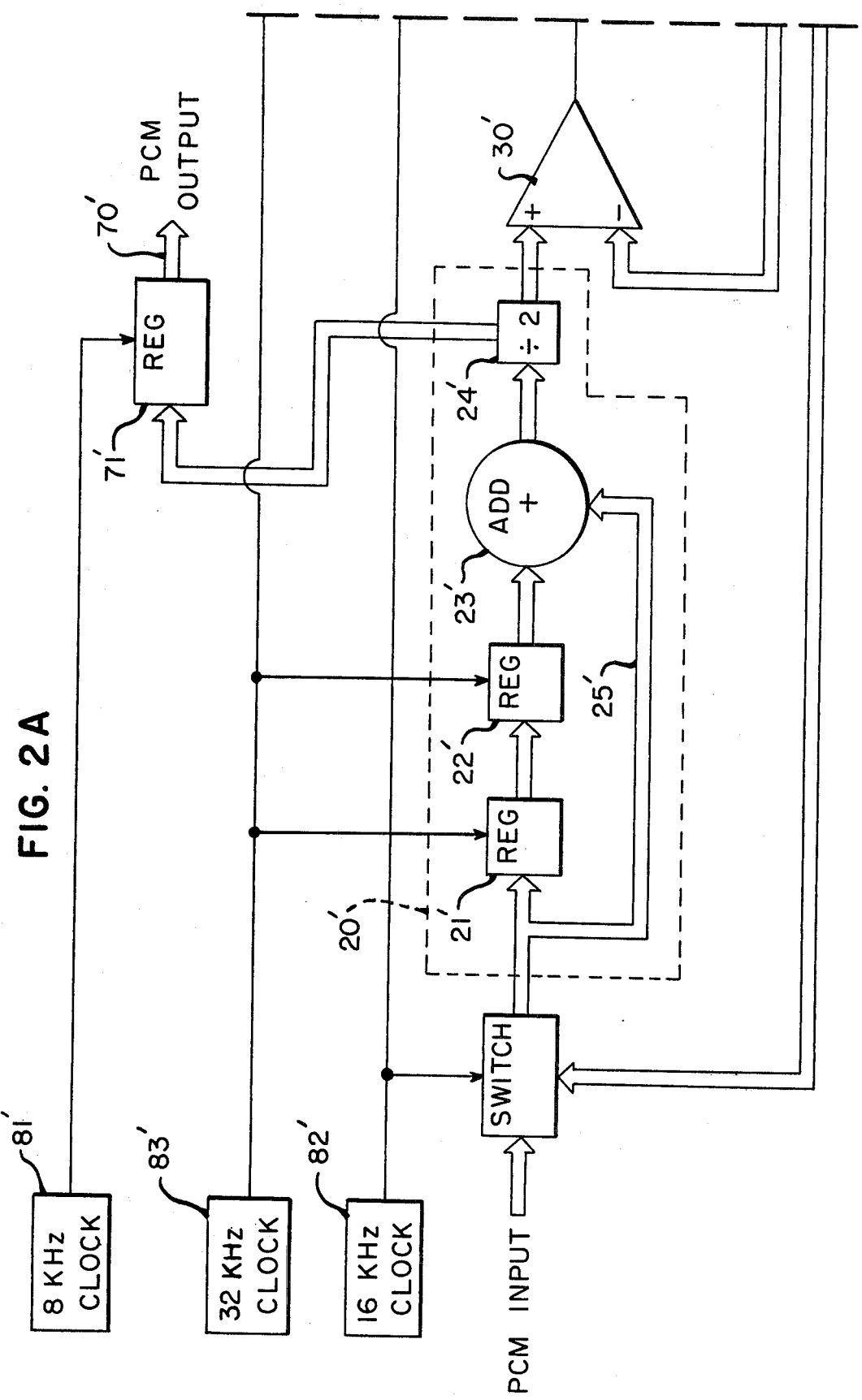

Referring now to FIG. 2 a modified form of an embodiment illustrated in FIG. 1 will be described. Corresponding elements having corresponding primed (') numbers. The important difference is that the feedback circuitry from the register 47 has been eliminated and a new feedback circuitry from the output, generally indicated at 90, has been connected between the output of the adder 45' and the input to switch 11'. Thus, with this circuit the latest prepared value of PCM data decoded from DM data is made available to the interpolator 20'. Thus, the lag created in decoding by the registers 46 and 47 is eliminated.

I claim:

1. A transcoder comprising:
   a first and a second transcoder input adapted to receive a first and a second type of modulation signal, respectively;
   a first and a second transcoder output;
   an interpolator having an input and an output, the output of said interpolator being operatively connected to said first transcoder output;
   a comparator having at least two inputs and one output, one of said comparator inputs operatively connected to the output of said interpolator, said comparator output operatively connected to said second transcoder output;
   an integrator having an input and an output, the output of said integrator being operatively connected to a second input of said comparator;
   first means for selectively connecting the input of said interpolator to either said first transcoder input or to said integrator output; and
   second means for selectively connecting the input of said integrator to either said second transcoder input or to said second transcoder output.

2. A transcoder as specified in claim 1, wherein said interpolator comprises a first shift register, a second shift register, and adder for adding the output from said second shift register and the input to said interpolator and a divider connected in series between the input and the output of said interpolator.

3. A transcoder as specified in claim 2, wherein said integrator comprises an inverter, a second adder, a third shift register, and a fourth shift register connected in series between said first and said second means, said adder being connected to said fourth shift register so as to add its contents to the output of said inverter.

4. A transcoder as specified in claim 3, wherein said first transcoder output is comprised of a fifth shift register having its input operatively connected to said divider with the output from said fifth shift register being a modulation signal.

5. A transcoder as specified in claim 4, wherein said second transcoder output is comprised of a sixth shift register having its input operatively connected to the output of said comparator, with the output from said sixth shift register being another modulation signal.

6. In combination with the transcoder as specified in claim 5:
   (a) first clock means connected to said first means, and to said second means to synchronously control said first and said second means at a predetermined rate;
   (b) a second clock means connected to said first, second, third, and fourth shift registers to shift said registers at twice the rate of said first clock means;
   (c) third clock means connected to said fifth shift register to shift said fifth register at half the rate of said first clock means; and
   (d) said first clock means also connected to said sixth shift register to shift said sixth shift register at said predetermined rate of said first clock means.

7. A combined encoder and decoder for converting between pulse code modulation (PCM) signals and differential code modulation (DM) signals comprising:
   (a) a PCM input;
   (b) a PCM output;
   (c) a DM input;
   (d) a DM output;
   (e) an interpolator connected to provide PCM signals to said PCM output;
   (f) an integrator;
   (g) a comparator connected to receive PCM signals from said interpolator and said integrator and connected to provide DM signals to said DM output;
   (h) first means for periodically alternatively connecting said PCM input and integrator to said interpolator; and
   (i) second means synchronized to said first means for periodically alternatively connecting said DM input and comparator to said integrator.

* * * * *